(12) United States Patent
Matsuda et al.

(10) Patent No.: US 9,718,941 B2
(45) Date of Patent: Aug. 1, 2017

(54) THERMOSETTING RESIN COMPOSITION, PREPREG, LAMINATE, METAL FOIL-CLAD LAMINATE, AND CIRCUIT BOARD

(75) Inventors: Takashi Matsuda, Fukushima (JP); Mitsuyoshi Nishino, Fukushima (JP); Kiyotaka Komori, Fukushima (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 342 days.

(21) Appl. No.: 14/115,306

(22) PCT Filed: Apr. 27, 2012

(86) PCT No.: PCT/JP2012/002906
§ 371 (c)(1),
(2), (4) Date: Nov. 1, 2013

(87) PCT Pub. No.: WO2012/150661
PCT Pub. Date: Nov. 8, 2012

(65) Prior Publication Data
US 2014/0087614 A1    Mar. 27, 2014

(30) Foreign Application Priority Data

May 2, 2011 (JP) .................................. 2011-103192

(51) Int. Cl.
*C08K 3/00* (2006.01)
*H05K 1/03* (2006.01)
(Continued)

(52) U.S. Cl.
CPC .............. *C08K 3/0033* (2013.01); *C08J 5/24* (2013.01); *C08K 3/22* (2013.01); *C08K 3/26* (2013.01);
(Continued)

(58) Field of Classification Search
CPC .... C08K 2003/2227; C08K 2003/2224; C08K 2003/2255; C08K 2003/222;
(Continued)

(56) References Cited

U.S. PATENT DOCUMENTS 6,361,866 B1 * 3/2002 Ogima ................... C08G 59/08
428/297.4
2002/0102206 A1  8/2002 Brown et al.
(Continued)

FOREIGN PATENT DOCUMENTS

JP        62-173245       7/1987
JP        0513891 B2 *    2/1993  ................ C01F 7/02
(Continued)

OTHER PUBLICATIONS

Wypych, George. (2010). Handbook of Fillers (3rd Edition). (p. 92). ChemTec Publishing.*
(Continued)

*Primary Examiner* — Frank Vineis
(74) *Attorney, Agent, or Firm* — McDermott Will & Emery LLP

(57) ABSTRACT

Provided is a thermosetting resin composition that contains 40 to 80 parts by volume of an inorganic filler with respect to 100 parts by volume of thermosetting resin solids and the inorganic filler. The inorganic filler contains (A) at least one type of particles selected from among gibbsite-type aluminum hydroxide particles and magnesium hydroxide particles having an average particle size ($D_{50}$) of 1 to 15 μm; (B) aluminum oxide particles having an average particle size ($D_{50}$) of 1.5 μm or less; and (C) a molybdenum compound, and the blending ratios (by volume) of the component (A), the component (B) and the component (C) with respect to
(Continued)

100% as the total amount of inorganic filler are component (A): 30 to 70%, component (B): 1 to 40%, and component (C): 1 to 10%.

10 Claims, 1 Drawing Sheet

(51) Int. Cl.
  *B32B 15/092* (2006.01)
  *C08L 63/00* (2006.01)
  *C08J 5/24* (2006.01)
  *C08K 3/22* (2006.01)
  *C08K 3/26* (2006.01)

(52) U.S. Cl.
  CPC ............ *C08L 63/00* (2013.01); *H05K 1/0366* (2013.01); *H05K 1/0373* (2013.01); *B32B 15/092* (2013.01); *B32B 2264/102* (2013.01); *B32B 2311/12* (2013.01); *B32B 2363/00* (2013.01); *B32B 2457/08* (2013.01); *C08J 2363/00* (2013.01); *C08K 2003/222* (2013.01); *C08K 2003/2224* (2013.01); *C08K 2003/2227* (2013.01); *C08K 2003/265* (2013.01); *C08K 2201/003* (2013.01); *C08K 2201/005* (2013.01); *C08K 2201/014* (2013.01); *H05K 2201/0209* (2013.01); *H05K 2201/0266* (2013.01); *Y10T 442/20* (2015.04); *Y10T 442/3431* (2015.04); *Y10T 442/3472* (2015.04)

(58) Field of Classification Search
  CPC ............ C08K 3/0033; C08K 2201/003; C08K 2201/005; C08K 3/22; B32B 27/20; B32B 27/38; B32B 2264/102; B32B 2264/105; B32B 2311/12; B32B 2311/24; B32B 2363/00; B32B 5/04; B32B 5/08; B32B 5/092; B32B 2305/076; B32B 2305/30; B32B 2305/74; B32B 2457/08
  USPC ....... 428/221, 323, 329, 357, 402, 328, 209, 428/457, 542.8, 901; 264/619; 174/250–268; 361/720, 721, 748–804
  See application file for complete search history.

(56) References Cited

U.S. PATENT DOCUMENTS

| | | | |
|---|---|---|---|
| 2003/0054152 A1 | 3/2003 | Brown et al. | |
| 2003/0059367 A1 | 3/2003 | Brown et al. | |
| 2003/0077482 A1 | 4/2003 | Brown et al. | |
| 2006/0216226 A1* | 9/2006 | Mitsunaka | C01F 7/448 423/629 |
| 2012/0077401 A1* | 3/2012 | Kotake | B32B 27/38 442/147 |

FOREIGN PATENT DOCUMENTS

| | | | | |
|---|---|---|---|---|
| JP | 2001-508002 A | 6/2001 | | |
| JP | 2005-162913 A | 6/2005 | | |
| JP | 2006-124434 A | 5/2006 | | |
| JP | WO 2009142192 A1 * | 11/2009 | ............ | H05K 1/036 |
| JP | WO 2010110433 A1 * | 9/2010 | ............ | B32B 27/38 |
| JP | WO 2011007638 A1 * | 1/2011 | ............... | C01F 5/02 |
| JP | 2011-084430 A | 4/2011 | | |
| JP | 2011-084431 A | 4/2011 | | |
| JP | 2455339 A1 * | 5/2012 | ............... | C01F 5/02 |
| TW | 201008778 A | 3/2010 | | |
| TW | 201105632 A | 2/2011 | | |
| WO | 2009/142192 A1 | 11/2009 | | |

OTHER PUBLICATIONS

International Search Report for International Application No. PCT/JP2012/002906 dated Jul. 10, 2012, 2 pages.
Taiwanese Office Action issued in Taiwanese Application No. 101115460, issued on Nov. 27, 2013, with partial English translation, 6 pgs.

* cited by examiner

THERMOSETTING RESIN COMPOSITION, PREPREG, LAMINATE, METAL FOIL-CLAD LAMINATE, AND CIRCUIT BOARD

RELATED APPLICATIONS

This application is the U.S. National Phase under 35 U.S.C. §371 of International Application No. PCT/JP2012/002906, filed on Apr. 27, 2012, which in turn claims the benefit of Japanese Application No. 2011-103192, filed on May 2, 2011, the disclosures of which are incorporated by reference herein.

TECHNICAL FIELD

The present invention relates to a novel thermosetting resin composition that is used in the production of superior circuit boards, and to a prepreg, a laminate, a metal foil-clad laminate and a circuit board which are produced using the thermosetting resin composition.

BACKGROUND ART

Laminates of so-called FR-4 type, which result from layering and molding sheets of prepreg obtained by impregnating a resin component, such as an epoxy resin, into a glass cloth, are widely used as typical laminates that are utilized in printed wiring board for electronic devices. The denomination FR-4 is a category defined in the standards of the American NEMA (National Electrical Manufactures Association). Also known are composite laminates, referred to as CEM-3 types, having a configuration wherein a layer in which a nonwoven fabric is impregnated with a resin component is disposed as a core material layer, and layers in which glass cloth is impregnated with a resin component is layered, as surface layers, on both surfaces of the core material layer.

For instance, Patent Document 1 discloses a composite laminate having high bonding strength between layers, and being excellent in alkali resistance, heat resistance, and punching workability, the composite laminate being obtained through bonding of a resin-impregnated surface layer material, which is in turn obtained by impregnating a glass cloth with a resin varnish, onto both faces of a resin-impregnated material core material resulting from impregnating a nonwoven fabric and/or paper with a resin varnish. The resin varnish that is used in the core material contains a filler that combines talc and aluminum hydroxide, the blending ratio of talc and aluminum hydroxide ranges from 0.15 to 0.65:1, and the aluminum hydroxide is of boehmite type.

For instance, Patent Document 2 discloses, as a composite laminate that is thermally stable and exhibits excellent flame retardancy, a laminated material for printed circuit boards that is made up of a surface layer comprising a resin-impregnated glass woven fabric and an interlayer comprising a curable resin-impregnated glass nonwoven fabric, wherein the interlayer contains aluminum hydroxide of molecular formula $Al_2O_3 \cdot nH_2O$ (in the formula, n is a value >2.6 and <2.9), in an amount of 200 wt % to 275 wt % with respect to the resin in the interlayer.

Advances in the miniaturization of electronic devices in recent years have been accompanied with increasingly higher mounting densities of electronic components that are mounted on printed wiring boards. Further, mounted electronic components include now also LEDs (Light Emitting Diodes) or the like that demand heat dissipation properties and that are mounted in the form of a plurality of electronic components. Conventional laminates, as substrates that are used for such applications, are problematic on account of their insufficient heat dissipation properties. Further, reflow soldering is the dominant mounting method. In particular, reflow soldering that utilizes lead-free solder and that requires a high-temperature reflow process, has become a mainstream process, with a view to reducing environmental impact. High heat resistance is required in order to suppress, for instance, the occurrence of blisters in a reflow soldering process where such lead-free solder is utilized. Preserving mechanical workability, in terms of drilling by a drill and milling by a router, constitutes herein a further requirement. Sufficient flame retardancy so as to satisfy the V-0 level of UL-94, from the viewpoint of safety, is yet another requirement.

High thermal conductivity fillers are ordinarily packed at a high density in order to realize high thermal conductivity in substrate materials. However, high thermal conductivity fillers have advantages and disadvantages, in that, at present, they fail to satisfy all features that are required in printed wiring boards for use in LED illumination and in ECU boards that are used in engine rooms.

As is known, for instance, the thermal conductivity of a resin composition is enhanced by using alumina (aluminum oxide), which has high thermal conductivity. Alumina, however, is very hard, and impairs the mechanical workability of the resin composition.

The heat dissipation properties of a laminate improve if aluminum hydroxide, which has somewhat high thermal conductivity, is blended in with a view to imparting heat dissipation properties to the laminate. Flame retardancy is enhanced in this case as well. If aluminum hydroxide was excessive, however, problems arose in that the heat resistance of the laminate dropped significantly, and blisters were likelier to occur during solder reflow.

If aluminum hydroxide and alumina are used concomitantly and the content of alumina is substantial, bits may break during machining such as drilling by a drill and milling using a router, given the extremely high hardness of alumina. Therefore, problems arose in that bits had to be replaced frequently, and also in terms of poorer flame retardancy. A further problem arose in that sufficient heat resistance and thermal conductivity could not be achieved if the blending amount of aluminum oxide was reduced in order to curtail bit breakage.

Magnesium oxide has thermal conductivity comparable to that of alumina, and hardness lower than that of alumina, and affords good workability of a resin molded product into which magnesium oxide is blended. However, magnesium oxide characteristically changes into magnesium hydroxide as a result of moisture absorption. Conceivable measures against such an occurrence include special firing and surface processing, but the price involved is high, or particle size is large, or fluidity at high packing is poor, all of which are drawbacks.

Aluminum nitride and boron nitride have non-spherical shapes, and hence resin flow worsens on account of structural viscosity. Both aluminum nitride and boron nitride are also problematic as regards costs, given the very high price that they command.

Patent Document 1: Japanese Patent Application Publication No. S62-173245
Patent Document 2: Japanese Translation of PCT Application No. 2001-508002

SUMMARY OF THE INVENTION

In order to solve the above problems, the inventors sought to provide a thermosetting resin composition that can be used in, for instance, a circuit board having excellent thermal conductivity, mechanical workability, flame retardancy, resin flow, moisture absorption insulation and price.

Specifically, one aspect of the present invention is a thermosetting resin composition that contains 40 to 80 parts by volume of an inorganic filler with respect to 100 parts by volume of thermosetting resin solids and the inorganic filler; wherein the inorganic filler contains (A) at least one type of particles selected from among gibbsite-type aluminum hydroxide particles and magnesium hydroxide particles having an average particle size ($D_{50}$) of 1 to 15 μm; (B) aluminum oxide particles having an average particle size ($D_{50}$) of 1.5 μm or less; and (C) a molybdenum compound, with blending ratios (by volume) of component (A): 30 to 70%, component (B): 1 to 40% and component (C): 1 to 10% with respect to 100% as the total amount of inorganic filler.

The present invention encompasses also the following features.

A prepreg obtained by impregnating the thermosetting resin composition into a woven fabric base material or nonwoven fabric base material.

A laminate obtained by layering and molding of one or a plurality of sheets of the prepreg.

A metal foil-clad laminate, wherein at least one surface of the laminate is clad with a metal foil.

A circuit board obtained by forming a circuit on the metal foil-clad laminate.

A laminate and a circuit board that are superior as regards all properties from among thermal conductivity, mechanical workability, flame retardancy, resin flow, moisture absorption insulation and price can be obtained by using the thermosetting resin composition of the present invention.

BEST MODE FOR CARRYING OUT THE INVENTION

Figure 1:
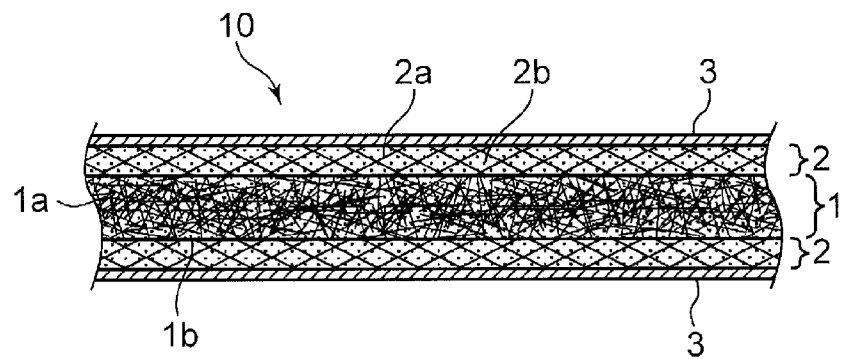
FIG. 1 is a schematic cross-sectional diagram of a composite laminate according to an embodiment of the present invention.

Preferred embodiments of the present invention are explained next.

The thermosetting resin composition according to the present embodiment comprises 40 to 80 parts by volume of an inorganic filler with respect to 100 parts by volume of thermosetting resin solids and the inorganic filler. The inorganic filler contains: (A) at least one type of particles selected from among gibbsite-type aluminum hydroxide particles and magnesium hydroxide particles having an average particle size ($D_{50}$) of 1 to 15 μm; (B) aluminum oxide particles having an average particle size ($D_{50}$) of 1.5 μm or less; and (C) a molybdenum compound, wherein the blending ratios (by volume) of the component (A), the component (B) and the component (C) with respect to 100% as the total amount of inorganic filler are component (A): 30 to 70%, component (B): 1 to 40%, and component (C): 1 to 10%.

Specific examples of the thermosetting resin that can be used include, for instance, liquid thermosetting resins such as epoxy resins, radical polymerization-type thermosetting resins such as unsaturated polyester resins and vinyl ester resins, and the like. A curing agent or curing catalyst may be blended into the thermosetting resin, as needed. If a radical polymerization-type thermosetting resin is used, radical polymerizable monomers such as styrene, diallyl phthalate or the like may be blended in, as appropriate. In all cases, a solvent may be blended in, as needed, in order to adjust viscosity and improve productivity.

The epoxy resin is not particularly limited, so long as it is an epoxy resin that makes up various kinds of organic substrate that can be used in the production of laminates and circuit boards. Specific examples include, for instance, bisphenol A epoxy resins, bisphenol F epoxy resins, bisphenol S epoxy resins, aralkyl epoxy resins, phenol novolac epoxy resin, alkylphenol novolac epoxy resins, biphenol epoxy resins, naphthalene epoxy resins, dicyclopentadiene epoxy resins, epoxidized products of condensates of phenols and aromatic aldehydes having phenolic hydroxyls, triglycidyl isocyanurate, and alicyclic epoxy resins. Depending on the circumstances, the foregoing may be used alone or in combinations of two or more types.

Herein there can be used, for instance, the above epoxy resins, a nitrogen-containing resin, a silicon-containing resin or the like, having been brominated or phosphorus-modified (phosphorus-containing resin) in order to impart flame retardancy to the resin composition, and by extension to a prepreg, a laminate and a circuit board. In this case as well, the foregoing may be used alone or in combinations of two or more types, depending on the circumstances. In environmental terms, it is better not to use a halogen-based flame retardant.

The curing agent that is blended in as needed is not particularly limited. Specific examples thereof include, for instance, dicyandiamide, phenolic curing agents, acid anhydride curing agents, aminotriazine novolac curing agents, cyanate resins and the like. Depending on the circumstances, the foregoing may be used alone or in combinations of two or more types.

In the present embodiment the blending proportion of the below-described inorganic filler ranges from 40 to 80 parts by volume, preferably from 50 to 70 parts by volume, and more preferably from 55 to 65 parts by volume, with respect to 100 parts by volume of thermosetting resin solids and the inorganic filler. The thermal conductivity of an ordinary thermosetting resin is low, of 0.2 W/m·K. Therefore, the thermal conductivity of the resin composition decreases when the proportion of the inorganic filler is smaller than 40 parts by volume. If the proportion exceeds 80 parts by volume, the melt viscosity of the resin composition increases, and flowability upon molding drops significantly. As a result, voids appear in the printed wiring board that is obtained using the resin composition, and the reliably of the printed wiring board is impaired.

The inorganic filler that is used in the present invention will be explained next in more detail.

The gibbsite-type aluminum hydroxide particles in component (A) are an aluminum compound represented by $Al(OH)_3$ or $Al_2O_3 \cdot 3H_2O$, and are a component that imparts well-balanced thermal conductivity, flame retardancy and mechanical workability to a laminated body.

Similarly, the magnesium hydroxide in the component (A) is a component that imparts well-balanced thermal conductivity, flame retardancy and mechanical workability to the laminated body.

The gibbsite-type aluminum hydroxide particles and the magnesium hydroxide have comparatively low hardness in the filler, and contribute to imparting flame retardancy.

The average particle size ($D_{50}$) of the gibbsite-type aluminum hydroxide particles and the magnesium hydroxide ranges from 1 to 15 μm, and preferably from 3 to 10 μm. If the average particle size ($D_{50}$) of the gibbsite-type aluminum hydroxide particles and the magnesium hydroxide exceeds 15 μm, insulation reliability decreases, while if the average particle size ($D_{50}$) is smaller than 1 μm, the melt viscosity of the resin composition increases, and flowability during molding becomes significantly impaired, and as a result, voids appear in the printed wiring board that is obtained using the resin composition.

In the present description, the average particle size ($D_{50}$) denotes the particle size at which a cumulative curve takes on a value or 50%, the cumulative curve being worked out, with 100% as the total volume of a collection of powder as obtained through measurement using a laser diffraction-type particle size distribution measurement instrument.

Preferably, the gibbsite-type aluminum hydroxide particles in the component (A) are subjected to a heat resistance process. Although various methods can be contemplated as heat resistance processes of gibbsite-type aluminum hydroxide, the heat resistance process in the present embodiment is a process such that, for instance, a boehmite phase becomes less than 15% of the total, at a 1% dehydration temperature of 250° C. or higher.

The gibbsite-type aluminum hydroxide particles and the magnesium hydroxide in the component (A) may each be used alone as the component (A), or may be used concomitantly.

The aluminum oxide (alumina) particles having an average particle size ($D_{50}$) of 1.5 μm or less in the component (B) are a component that imparts thermal conductivity without lowering the heat resistance of the circuit board. Aluminum oxide exhibits high hardness but is advantageous in terms of being amenable to high packing.

The average particle size ($D_{50}$) of the aluminum oxide is not particularly limited, so long as it is 1.5 μm or less, but ranges preferably from 0.4 to 0.8 μm. The router or drill bits that are ordinarily used during machining of a printed wiring board break frequently if the average particle size of the aluminum oxide particles exceeds 1.5 μm.

The molybdenum compound that is the component (C) is a component for further enhancing mechanical workability.

Examples of the molybdenum compound that can be used in the present embodiment include, for instance, molybdenum oxides and molybdic acid compounds such as molybdenum trioxide, zinc molybdate, ammonium molybdate, magnesium molybdate, calcium molybdate, barium molybdate, sodium molybdate, potassium molybdate, phosphomolybdic acid, ammonium phosphomolybdate, sodium phosphomolybdate, silicomolybdic acid or the like, as well as molybdenum compounds such as molybdenum boride, molybdenum disilicide, molybdenum nitride, molybdenum carbide or the like. The foregoing may be used alone or in mixtures of two or more types.

Zinc molybdate, calcium molybdate, magnesium molybdate or the like are preferably used among the foregoing, in terms of chemical stability, moisture resistance and insulation properties.

The above molybdenum compounds have low oil absorption, and hence do not affect the fluidity of the resin composition when blended into the latter within the formulation ranges of the present invention.

Preferably, the molybdenum compound is supported on a filler, in terms of dispersibility and economy. The filler used as a carrier has preferably low oil absorption, in terms of satisfactorily preserving the fluidity of the resin composition. Specific examples of the filler include, for instance, zinc oxide, aluminum oxide, calcium carbonate, barium sulfate and the like.

A commercially available product of such a molybdenum compound can be used herein. Specific examples thereof include, for instance, Kemgard 911A, Kemgard 911B, and Kemgard 911C by Sherwin-Williams.

The blending ratios (by volume) of at least one type of particles selected from among the gibbsite-type aluminum hydroxide particles and magnesium hydroxide particles (A), the aluminum oxide particles (B) and the molybdenum compound (C) with respect to the total inorganic filler range respectively from 30 to 70%, 1 to 40% and 1 to 10%, and preferably from 35 to 65%, 5 to 35% and 2 to 8%.

If the blending ratio of the component (A) is smaller than the above range, flame retardancy may be insufficient, while if the range is exceeded, heat resistance and insulation reliability may drop.

If the blending ratio of the aluminum oxide particles (B) is smaller than the above range, resin flow and moldability may be poor, while if the range is exceeded, mechanical workability may decrease in that, for instance, drills and router bits break frequently.

If the blending ratio of the molybdenum compound (C) is smaller than the above range, the effect of enhancing mechanical workability cannot be elicited sufficiently, and drills and router bits break readily. If the above range is exceeded, on the other hand, the peel strength of copper foil decreases, and also the thermal decomposition temperature may drop.

Besides the above components, (D) boehmite particles having an average particle size ($D_{50}$) of 0.1 to 3 μm may be incorporated as the inorganic filler in the present embodiment. It is deemed that incorporating boehmite particles of small particle size allows packing the inorganic filler yet more densely. It is likewise deemed that incorporating such boehmite particles allows further reducing the content of aluminum oxide, and by extension, allows enhancing mechanical workability.

If the composition contains also such boehmite particles (D) having an average particle size ($D_{50}$) of 0.1 to 3 μm, the blending ratios (by volume) of the at least one type of particles selected from among the gibbsite-type aluminum hydroxide particles and magnesium hydroxide particles (A), the aluminum oxide particles (B), the molybdenum compound (C) and the boehmite particles (D) with respect to the total inorganic filler range respectively from 30 to 70%, 1 to 30%, 1 to 10% and 10 to 30%. If the blending ratio of the boehmite particles (D) is smaller than 10%, the effect on moldability and suppression of resin flow may weaken, while if the blending ratio exceeds 30%, resin flow and moldability may worsen (it is deemed that the influence exerted by the increase in specific surface area weighs herein more than the effect of enabling higher filler packing as elicited through the addition of small particles).

In addition to the above components, the composition may further contain (E) inorganic particles having an average particle size ($D_{50}$) of 0.1 to 15 μm and exhibiting a thermal conductivity of 9 W/mK or higher, as the inorganic filler in the present embodiment. It is deemed that thermal conductivity can be further enhanced by further incorporating such high thermal conductivity filler.

Inorganic particles that can be used as the above inorganic particles (E) are not particularly limited, so long as the particles have electric insulation properties, have an average particle size ($D_{50}$) of 0.1 to 15 μm, and have a thermal conductivity of 9 W/mK or higher. Specific examples thereof include, for instance, magnesium oxide, aluminum nitride, boron nitride, magnesium carbonate, zinc oxide and the like.

Magnesium oxide having an average particle size ($D_{50}$) of 1 to 15 μm is preferably used among the foregoing. Magnesium oxide having a thermal conductivity of 9 W/mK or higher can be obtained, for instance, by firing magnesium hydroxide or magnesium carbonate at 1600 to 2000° C. It is deemed that if the firing temperature is lower than 1600° C., inorganic particles having sufficient thermal conductivity fail to be obtained, and moisture resistance is impaired. If the firing temperature exceeds 2000° C., on the other hand, the inorganic particles become excessively hard, and become difficult to pulverize, as a filler, to an appropriate particle size. The specific surface area of the particles increases upon intense pulverization, but this may result in lower flowability and in impaired moldability of the resin composition.

Accordingly, it is preferable to use magnesium oxide that is obtained by firing magnesium hydroxide or magnesium carbonate at 1600 to 2000° C., followed by crushing and sorting of the obtained fused particles.

The magnesium oxide thus obtained is magnesium oxide that satisfies Formula (1) below.

$$1 \leq BET/S \leq 5 \qquad (1)$$

(In the formula, BET denotes the BET specific surface area [m²/g], S denotes a theoretical calculated value of specific surface area, in spherical conversion, represented by 6/(average particle size [μm])×(density [g/cm³]).)

More preferably, the magnesium oxide satisfies Formula (2) below, since in that case the magnesium oxide can be continuously fired in a rotary kiln or the like, which is advantageous in terms of further keeping production prices down.

$$2 \leq BET/S \leq 5 \qquad (2)$$

(Elements in the Formula Same as Above)

If BET/S exceeds 5 in the above formulas, the resin composition may exhibit loss of fluidity, moldability may be impaired, and moisture resistance may also be poor.

The average particle size ($D_{50}$) of the above magnesium oxide particles is 1 to 15 μm. If the average particle size is smaller than 1 μm, the specific surface area increases, and fluidity may be impaired. Also, it is deemed that that moisture resistance may likewise worsen. On the other hand, an average particle size greater than 15 μm makes cracks likelier to occur at the interface with the resin, and insulation reliability may be impaired. Further, it may become more difficult to produce prepreg thin enough as required as a base material for mobile devices.

If inorganic particles (E) are thus contained, the blending ratios (volume ratios) of the at least one selected from the gibbsite-type aluminum hydroxide particles and magnesium hydroxide particles (A), the aluminum oxide particles (B), the molybdenum compound (C), the boehmite particles (D) and the inorganic particles (E) with respect to the total inorganic filler range respectively from 30 to 50%, 1 to 20%, 1 to 5%, 10 to 30% and 10 to 50%.

If the blending ratio of the inorganic particles (E) is smaller than 10%, the effect of enhancing thermal conductivity is weakened, while flowability during molding decreases if the blending ratio exceeds 50%.

If the above inorganic particles (D) to (E) are also present in addition to components (A) to (C), the content of inorganic particles (D)+(E) may be 68% or less, preferably 60% or less, with respect to the volume of the total inorganic filler.

The content of other inorganic particles other than those of components (A) to (E) may be about 10% or less with respect to the volume of the total inorganic filler, but the total of other inorganic particles and the inorganic particles (D)+(E) is 68% or less, preferably 60% or less, with respect to the volume of the total inorganic filler.

The thermosetting resin composition is prepared in accordance with a known preparation method that involves blending the above-described inorganic particle component into a liquid thermosetting resin, and dispersing the various inorganic particles using a disperser, a ball mill, a roll or the like. An organic solvent or various additives may be added, as needed, in order to adjust viscosity.

An explanation follows next on a prepreg that utilizes the above thermosetting resin composition.

The prepreg that utilizes the above thermosetting resin composition can be obtained by impregnating the above thermosetting resin composition into a fibrous base material such as a woven fabric (cloth) or nonwoven fabric.

Examples of the fibers that form a fibrous base material include, for instance, glass fibers, synthetic fibers such as aramid fibers, polyester fibers, nylon fibers or the like, and natural fibers.

The thickness of the fibrous base material is not particularly limited, and may range for instance, by way of example, from about 10 to 300 μm.

The prepreg is obtained through impregnation and semi-curing of the above thermosetting resin composition into such a fibrous base material. Specifically, the thermosetting resin composition is impregnated into the fibrous base material, and the thermosetting resin composition that impregnates the fibrous base material is dried through heating. A prepreg is obtained as a result in which the thermosetting resin is in a semi-cured state.

One or a plurality of sheets of prepreg is then stacked, with metal foil on the outer side(s), and the whole is heated and pressed at a predetermined temperature and predetermined pressure, to yield thereby a circuit board.

In the present embodiment, the thermosetting resin composition solids range from 50 to 90 parts by volume with respect to 100 parts by volume as the total of the thermosetting resin composition solids and the fibrous base material. The thermal conductivity of the fibrous base material is ordinarily low. For instance, the thermal conductivity of glass fibers is 1.0 W/m·K. Accordingly, prepreg of high thermal conductivity, in excess of 1.0 W/m·K, cannot be obtained when the thermosetting resin composition solids are smaller than 50 parts by volume. Further, the volume ratio of the thermosetting resin in the prepreg is lower in such an instance, and hence flowability during molding decreases. If the thermosetting resin composition solids exceed 90 parts by volume, on the other hand, the volume ratio of the structure-constituting fibrous base material decreases, and strength becomes accordingly insufficient.

A composite laminate 10 that utilizes the above thermosetting resin composition will be explained next with reference to FIG. 1.

The composite laminate 10 has a layer structure in which a core material layer 1 and surface material layers 2 respectively layered on both surfaces of the core material layer 1 are integrated. Metal foils 3 are further layered on the surface layers of the composite laminate 10, to configure thereby a metal foil-clad laminate.

The core material layer 1 is made up of a nonwoven fibrous base material 1a and a thermosetting resin composition 1b such as the above-described one. The surface material layer 2 is made up of a woven fibrous base material 2a and a resin composition 2b.

The method for producing the composite laminate 10 will be explained next in detail.

The prepreg for forming the core material layer 1 (hereafter also referred to as core material layer prepreg) will be explained first.

The core material layer prepreg is obtained through impregnation of the above-described thermosetting resin composition into the nonwoven fibrous base material 1a, which is for instance a glass nonwoven fabric, glass paper, a synthetic resin nonwoven fabric, paper or the like.

The type of nonwoven fibrous base material is not particularly limited, and examples thereof include, for instance, a glass nonwoven fabric or glass paper, or a synthetic resin nonwoven fabric that utilizes synthetic resin fibers such as aramid fibers, polyester fibers, nylon fibers or the like, and paper or the like. The drilling workability of the composite laminated body is enhanced since such a nonwoven fibrous base material is coarser than a woven fibrous base material.

The prepreg for forming the surface material layer 2 (hereafter also referred to as surface material layer prepreg) will be explained next.

The surface material layer prepreg is obtained through impregnation of a resin varnish of a thermosetting resin into the woven fibrous base material 2a, such as glass cloth (woven fabric), or a synthetic fiber cloth (woven fabric) that utilizes synthetic fibers such as aramid fibers, polyester fibers, nylon fibers or the like. Thus, the dimensional stability and heat resistance of the obtained composite laminate can be enhanced through the use of a woven fibrous base material in the surface material layer.

As the resin varnish for forming the surface material layer prepreg there can be used a resin varnish that has, as a resin component, a radical polymerization-type thermosetting resin such as an epoxy resin, an unsaturated polyester resin, a vinyl ester resin or the like, identical to those used in the production of the core material layer prepreg. Various reaction initiators and curing agents may be added, as needed, to the resin varnish for forming the surface material layer prepreg. A filler may be blended in, as needed, in an appropriate amount such that the effect of the present invention is not impaired.

The surface material layer prepregs are layered on both surfaces of the core material layer prepreg, and then the metal foils 3 are further layered on both surfaces; the resulting laminated body is laminate-molded to yield thereby the composite laminate 10 clad with metal foil. The core material layer prepreg and the surface material layer prepreg may be adjusted as appropriate, and may each be present as one layer alone, or as plurality of layers, specifically in the form of a stack of one to three layers.

The metal foil that is used is not particularly limited, and may be copper foil, aluminum foil, nickel foil or the like. The metal foil may be provided on both surfaces or one surface alone. On the face on which the metal foil is not provided there may be disposed a release film instead of the metal foil, whereupon the laminated body is then heated and press-molded.

A circuit board can then be obtained by performing known wiring processing and through-hole processing, in accordance with, for instance, an additive or a subtractive method, on the composite laminate 10 thus formed.

In the composite laminate 10 of the present embodiment, the gibbsite-type aluminum hydroxide particles (A) are blended into the resin composition that makes up the core material layer 1, and a predetermined amount of the molybdenum compound (C) is also blended in. As a result, it becomes possible to suppress breakage of drill and router bits at the time of machining, despite the fact that a predetermined amount of aluminum oxide particles (B) of high hardness is also blended into the composition. The life of drill and router bits can be extended as a result. Further, a predetermined amount of aluminum oxide particles (B) of small average particle size is also blended in; as a result, it becomes possible to smoothly form inner faces of through-holes, such that irregularities are unlikely to form on the inner faces of formed holes, also when drilling is resorted to in order to form the through-holes. Accordingly, high conduction reliability can be imparted to the through-holes even when the through-holes are formed by subjecting the inner face of the through-holes to hole plating. Further, the thermal conductivity of the laminate can be significantly enhanced by blending in the aluminum oxide particles (B) having excellent thermal conductivity.

The composite laminate of excellent thermal conductivity and drilling workability of the present embodiment is preferably used in applications where high heat dissipation properties are required, for instance printed wiring boards in LED backlight units such as those that are mounted on liquid crystal displays, as well as in printed wiring boards for LED illumination.

Figure 2:
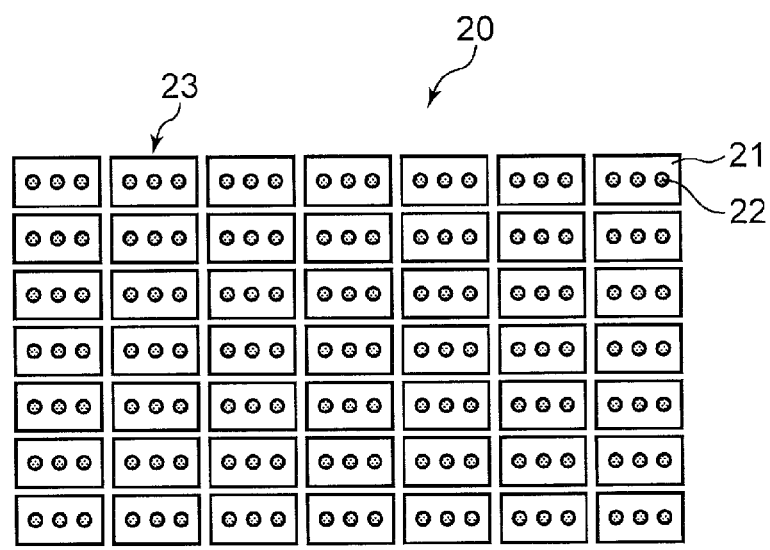
FIG. 2 is a schematic configuration diagram of an LED backlight unit.

A specific example of LED applications includes, for instance, a LED backlight unit 20 such as the one illustrated in the schematic top-view diagram of FIG. 2, and which is mounted on a liquid crystal display. The LED backlight unit 20 of FIG. 2 is made up of an array of multiple LED modules 23 each of which has a plurality of LEDs 22 (three in FIG. 2) mounted on a printed wiring board 21. The LED backlight unit 20 is arranged on the rear face of a liquid crystal panel and has power supplied thereto; thereby the LED backlight unit 20 is used as a backlight of a liquid crystal display or the like. Cold cathode tubes (CCFLs) have come to be widely used as backlights in liquid crystal displays of widely adopted conventional types, but recent years have witnessed the active development of LED backlight units such as the above-described ones, which are advantageous in terms of affording enhanced image quality, in that they allow widening the color gamut beyond that of cold-cathode tube backlights, incur low environmental impact since they are mercury-free, and can be made into thinner profiles.

Ordinarily, LED modules exhibit large heat loss, and generate accordingly a substantial amount of heat. The problem of heat dissipation can be significantly improved herein through the use of the composite laminate of the present invention, as the printed wiring board 21 from which such high heat dissipation properties are required. The luminous efficiency of the LEDs can be accordingly enhanced.

Examples of the present invention are explained next in further detail. The present invention, however, is not limited to any of these examples.

EXAMPLES

Firstly, a phosphorus-containing epoxy resin was prepared, as described below, as a thermosetting resin composition that was used in the examples.

(Phosphorus-Containing Epoxy Resin)

Herein, 130 parts by weight of HCA and 400 parts by weight of xylene, as a reaction solvent, were charged in a four-necked separable flask provided with a stirring device, a thermometer, a cooling tube and a nitrogen gas-introducing device, and the charge was dissolved by heating. Thereafter, 94 parts by weight of 1,4-naphthoquinone were divisionally added while monitoring the rise in temperature elicited by reaction heat. There were 1.02 moles of the phosphorus compound HCA with respect to 1 mole of 1,4-naphthoquinone. After the reaction, 300 parts by weight of the solvent were recovered, and then there were charged 350 parts by weight of EPPN-501H (trifunctional epoxy resin, epoxy equivalent 165 g/eq, by Nippon Kayaku), 250 parts by weight of Epotohto ZX-1355 (1,4-dihydroxynaphthalene-type epoxy resin, epoxy equivalent 145 g/eq, by Tohto Kasei), and 176 parts by weight of Epotohto YDF-170 (bisphenol F epoxy resin, epoxy equivalent 168 g/eq, by Tohto Kasei). The whole was heated and stirred, under introduction of nitrogen gas, and further solvent was recovered. Then 0.22 parts by weight of triphenylphosphine, as a catalyst, were added, and the whole was left to react at 160° C. for 4 hours. The obtained epoxy resin amounted to 42.6 wt %, the epoxy equivalent to 273.5 g/eq and the phosphorus content to 1.85 wt %.

Example 1

Production of Prepreg

Herein, 57 parts by volume of an inorganic filler with respect to 100 parts by volume of the thermosetting resin solids and inorganic filler were incorporated into a thermosetting resin varnish that contained the phosphorus-containing epoxy resin prepared in accordance with the above method and a dicyandiamide (Dicy)-based curing agent. In the inorganic filler there were blended, and uniformly dispersed, 57 parts by volume of gibbsite-type aluminum hydroxide (by Sumitomo Chemical, $D_{50}$: 5.4 μm), 38 parts by volume of aluminum oxide (by Sumitomo Chemical, $D_{50}$: 0.76 μm), and 5 parts by volume of zinc molybdate-treated talc (by Sherwin-Williams), with respect to 100 parts by volume of the inorganic filler. Glass cloth (by Nitto Boseki) having a basis weight of 47 g/m² and a thickness of 53 μm was impregnated with the resin varnish having the filler blended thereinto, to yield a prepreg. The cloth volume was 20 vol %.

<Production of a Laminated Body>

Herein, eight sheets of the obtained prepreg were stacked, and 0.018 mm-thick copper foil was overlaid on the outer surfaces of the stack, to yield a laminated body. The laminated body was sandwiched between two metal plates, and was heat-molded under conditions of temperature 180° C. and pressure 30 kg/m², to yield a 0.8 mm thick-copper foil-clad laminate.

The obtained copper foil-clad laminate was evaluated as regards thermal conductivity, oven heat resistance test, 260° C. solder heat resistance test, pressure cooker test (PCT), router milling distance, flame retardancy and melt viscosity, in accordance with the evaluation methods below. The results are given in Table 1.

[Thermal Conductivity]

The density of the obtained copper foil-clad laminate was measured in accordance with a water displacement method, the specific heat was measured by DSC (differential scanning calorimetry), and thermal diffusivity was measured in accordance with a laser flash method.

Thermal conductivity was calculated on the basis of the formula below.

Thermal conductivity (W/m·K)=density (kg/m³)× specific heat (kJ/kg·K)×thermal diffusivity (m²/S)×1000

[Oven Heat Resistance Test]

A test piece prepared in accordance with JIS C 6481 using the obtained copper foil-clad laminate was subjected to a one-hour process in a thermostatic bath, equipped with an air circulating device, and set to 200° C. If no blisters or peeling occurred in the copper foil and the laminate, the temperature of the thermostatic bath was raised by 10° C., and the process was further performed for one hour. This operation was repeated until blisters and peeling occurred in the copper foil and the laminate. The highest temperature at which no blisters or peeling occurred was determined to be the oven heat resistance temperature.

[260° C. Solder Heat Resistance Test]

A test piece prepared in accordance with JIS C 6481 using the obtained copper foil-clad laminate was dipped in a solder bath at 260° C. for 180 seconds, and there was determined the longest time over which no blisters or peeling occurred in the copper foil and the laminate.

[Pressure Cooker Test (PCT)]

A test piece prepared in accordance with JIS C 6481, using the obtained copper foil-clad laminate, was processed for 60 minutes in an autoclave at 121° C. and 2 atmospheres. The processed laminate was dipped in a solder bath at 260° C. for 180 seconds, and there was determined the longest time over which no blisters or peeling occurred in the copper foil and the laminate.

[Router Milling Distance]

Three sheets of the obtained laminated body were stacked, and were milled in a router (bit diameter 1.5 mm), at 30000 revolutions/minute, feed rate 1.25 m/minute and descent rate 500 mm/minute, and there was determined the milling distance at the time of bit breakage.

[Flame Retardancy]

The obtained copper foil-clad laminate was cut to a predetermined size, and a combustion test was performed in accordance with the combustion test of UL 94, to determine flame retardancy.

[Prepreg Melt Viscosity]

The obtained prepreg was kneaded, a powder of the thermosetting resin composition was dropped thereonto, and the resulting powder was charged in a predetermined mold and was direct-molded, to yield a resin rod. The resin rod was charged next in the heating unit of a Koka flow tester (capillary rheometer-type flow tester), and the melt viscosity at 130±0.2° C. was measured.

Examples 2 to 11 and Comparative Examples 1 to 15

Laminated bodies were obtained and evaluated in the same way as in Example 1, but herein the composition of the resin composition in the production of the core material layer prepreg was modified as given in Table 1 and Table 2. The results are given in Table 1 and Table 2.

The materials used were as follows.
(A) aluminum hydroxide ($D_{50}$: 12 μm)
(A) aluminum hydroxide ($D_{50}$: 4 μm)
(A) magnesium hydroxide ($D_{50}$: 5 μm)
(C) zinc molybdate (talc carrier), by Sherwin-Williams, "Kemgard 911C" (oil absorption: 41 g/100 g)
(C) calcium molybdate (calcium carbonate carrier), by Sherwin-Williams "Kemgard 911A" (oil absorption: 18 g/100 g)
(D) boehmite of average particle size ($D_{50}$) 0.9 μm
(E) magnesium oxide ($D_{50}$: 5 μm, BET/S=3)
(E) pulverized magnesium oxide particles having average particle size ($D_{50}$) 3 μm (BET/S=6)
(E) aluminum nitride having average particle size ($D_{50}$) 1 μm
(others as used in comparative examples)
silica particles of average particle size ($D_{50}$) 0.6 μm
aluminum oxide particles (alumina) of average particle size ($D_{50}$) 7 μm

TABLE 1

|  |  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Inorganic filler blend (volume ratio) | (A) Aluminum hydroxide (12μ) | 57 |  |  |  |  |  |  |  |  | — | — |
|  | (A) Aluminum hydroxide (4μ) |  | 57 |  | 57 | 60 | 57 | 55 | 37 | 35 | 37 | 37 |
|  | (A) Magnesium hydroxide (5μ) |  |  | 57 |  |  |  |  |  |  |  |  |
|  | (B) Alumina (0.5μ) | 38 | 38 | 38 | 38 | 20 | 28 | 15 | 10 | 13 | 10 | 10 |
|  | (C) Zinc molybdate-treated talc |  |  |  | 5 |  |  |  |  |  |  |  |
|  | (C) Calcium molybdate-calcium carbonate | 5 | 5 | 5 |  | 5 | 5 | 5 | 2 | 2 | 3 | 2 |
|  | (D) Boehmite (0.9μ) |  |  |  |  | 15 |  | 15 | 15 |  | 14 | 15 |
|  | (E) Magnesium oxide (5μ) BET/S = 3 |  |  |  |  |  |  |  |  | 50 | 36 | 36 |
|  | (E) pulverized magnesium oxide (3μ) BET/S = 6 |  |  |  |  |  |  |  | 36 |  |  |  |
|  | (E) aluminum nitride (1μ) |  |  |  |  |  | 10 | 10 |  |  |  |  |
|  | Silica |  |  |  |  |  |  |  |  |  |  |  |
|  | Alumina (7μ) | — | — | — |  |  |  |  |  |  | — | — |
| Resin composition volume ratio | Filler/resin composition (vol %) | 57 | 57 | 57 | 57 | 57 | 57 | 57 | 57 | 57 | 57 | 57 |
|  | Resin/resin composition (vol %) | 43 | 43 | 43 | 43 | 43 | 43 | 43 | 43 | 43 | 43 | 43 |
|  | Inorganic filler (parts by volume) | 133 | 133 | 133 | 133 | 133 | 133 | 133 | 133 | 133 | 133 | 133 |
|  | Epoxy resin + curing agent (parts by volume) | 100 | 100 | 100 | 100 | 100 | 100 | 100 | 100 | 100 | 100 | 100 |
|  | Glass cloth | #1080 | #1080 | #1080 | #1080 | #1080 | #1080 | #1080 | #1080 | #1080 | #1080 | #1080 |
|  | Cloth content (vol %) | 20 | 20 | 20 | 20 | 20 | 20 | 20 | 20 | 20 | 20 | 20 |
| Example | Thermal conductivity | 1.4 | 1.3 | 1.3 | 1.3 | 1.2 | 1.3 | 1.4 | 1.3 | 1.5 | 1.4 | 1.4 |
|  | 240° C. oven heat resistance | 240 | 260 | 260 | 260 | 260 | 260 | 260 | 260 | 260 | 260 | 260 |
|  | 260° C. solder heat resistance | 180 | 180 | 180 | 180 | 180 | 180 | 180 | 180 | 180 | 180 | 180 |
|  | PCT | 180 | 180 | 180 | 180 | 180 | 180 | 180 | 180 | 180 | 180 | 180 |
|  | Router milling distance (0.8t * 3) | 6 | 6 | 6 | 6 | 15 | 8 | 10 | 15 | 6 | 22 | 15 |
|  | X: 0 to 4 m, Δ: 5 to 9 m, ○: 10 to 14 m, ⊗: >15 m | Δ | Δ | Δ | Δ | ⊗ | Δ | ○ | ⊗ | Δ | ⊗ | ⊗ |
|  | Flame retardancy | V-0 | V-0 | V-0 | V-0 | V-0 | V-0 | V-0 | V-0 | V-0 | V-0 | V-0 |
|  | Melt viscosity [Pa · s] | 400 | 800 | 800 | 1500 | 1200 | 1500 | 1500 | 2000 | 2000 | 800 | 500 |
|  | Voids | No | No | No | No | No | No | No | No | No | No | No |

TABLE 2

|  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 |
|---|---|---|---|---|---|---|---|---|---|
| Inorganic filler blend (volume ratio) | (A) Aluminum hydroxide (12μ) |  |  | 25 |  | 60 |  |  | 80 |
|  | (A) Aluminum hydroxide (4μ) | 75 | 75 |  | 40 |  | 60 |  |  |
|  | (A) Magnesium hydroxide (5μ) |  |  |  |  |  |  | 60 |  |
|  | (B) Alumina (0.5μ) |  |  |  |  | 40 | 40 | 40 | 20 |
|  | (C) Zinc molybdate-treated talc |  |  |  |  |  |  |  |  |
|  | (C) Calcium molybdate-calcium carbonate |  |  |  |  |  |  |  |  |
|  | (D) Boehmite (0.9μ) |  |  |  |  |  |  |  |  |
|  | (E) Magnesium oxide (5u) BET/S = 3 |  |  |  |  |  | 60 |  |  |
|  | (E) pulverized magnesium oxide (3μ) BET/S = 6 |  |  |  |  |  |  |  |  |
|  | (E) aluminum nitride (1μ) |  |  |  |  |  |  |  |  |
|  | Silica |  | 25 | 25 |  |  |  |  |  |
|  | Alumina (7μ) |  |  |  | 75 |  |  |  |  |
| Resin composition volume ratio | Filler/resin composition (vol %) | 20 | 57 | 57 | 57 | 57 | 57 | 57 | 57 |
|  | Resin/resin composition (vol %) | 80 | 43 | 43 | 43 | 43 | 43 | 43 | 43 |
|  | Inorganic filler (parts by volume) | 25 | 133 | 133 | 133 | 133 | 133 | 133 | 133 |
|  | Epoxy resin + curing agent (parts by volume) | 100 | 100 | 100 | 100 | 100 | 100 | 100 | 100 |
|  | Glass cloth | #2116 | #1080 | #1080 | #1080 | #1080 | #1080 | #1080 | #1080 |
|  | Cloth content (vol %) | 54 | 20 | 20 | 20 | 20 | 20 | 20 | 20 |
| Example | Thermal conductivity | 0.5 | 1.1 | 1.4 | 1.4 | 1.4 | 1.3 | 1.3 | 1.2 |
|  | 240° C. oven heat resistance | 260 | 250 | 240 | 250 | 240 | 250 | 250 | 220 |
|  | 260° C. solder heat resistance | 180 | 180 | 180 | 180 | 180 | 180 | 180 | 60 |
|  | PCT | 180 | 180 | 180 | 180 | 180 | 180 | 180 | 180 |
|  | Router milling distance (0.8t * 3) | 35 | 15 | <1 | 12 | 2 | 2 | 2 | 12 |

TABLE 2-continued

|  |  |  |  |  |  |  |  |  |
|---|---|---|---|---|---|---|---|---|
| X: 0 to 4 m, Δ: 5 to 9 m, ○: 10 to 14 m, ⊗: >15 m | ⊗ | ⊗ | X | ○ | X | X | X | ○ |
| Flame retardancy | V-0 | V-0 | X | V-0 | V-0 | V-0 | V-0 | V-0 |
| Melt viscosity [Pa · s] | 100 | 2000 | 200 | 8000 | 400 | 1000 | 800 | 800 |
| Voids | No | Yes | No | Yes | No | No | No | No |

|  |  | Comp. Ex. 9 | Comp. Ex. 10 | Comp. Ex. 11 | Comp. Ex. 12 | Comp. Ex. 13 | Comp. Ex. 14 | Comp. Ex. 15 |
|---|---|---|---|---|---|---|---|---|
| Inorganic filler blend (volume ratio) | (A) Aluminum hydroxide (12μ) |  |  |  |  |  |  |  |
|  | (A) Aluminum hydroxide (4μ) | 80 |  | 60 | 60 | 40 | 45 | 60 |
|  | (A) Magnesium hydroxide (5μ) |  | 80 |  |  |  |  |  |
|  | (B) Alumina (0.5μ) | 20 | 20 | 25 | 20 | 10 | 15 | 10 |
|  | (C) Zinc molybdate-treated talc |  |  |  |  |  |  |  |
|  | (C) Calcium molybdate-calcium carbonate |  |  |  |  |  |  | 5 |
|  | (D) Boehmite (0.9μ) |  |  | 15 | 20 | 15 | 15 | 15 |
|  | (E) Magnesium oxide (5u) BET/S = 3 |  |  |  |  | 35 | 25 |  |
|  | (E) pulverized magnesium oxide (3μ) BET/S = 6 |  |  |  |  |  |  |  |
|  | (E) aluminum nitride (1μ) |  |  |  |  |  |  |  |
|  | Silica |  |  |  |  |  |  |  |
|  | Alumina (7μ) |  |  |  |  |  |  |  |
| Resin composition volume ratio | Filler/resin composition (vol %) | 57 | 57 | 57 | 57 | 57 | 57 | 85 |
|  | Resin/resin composition (vol %) | 43 | 43 | 43 | 43 | 43 | 43 | 15 |
|  | Inorganic filler (parts by volume) | 133 | 133 | 133 | 133 | 133 | 133 | 567 |
|  | Epoxy resin + curing agent (parts by volume) | 100 | 100 | 100 | 100 | 100 | 100 | 100 |
|  | Glass cloth | #1080 | #1080 | #1080 | #1080 | #1080 | #1080 | #1080 |
|  | Cloth content (vol %) | 20 | 20 | 20 | 20 | 20 | 20 | 20 |
| Example | Thermal conductivity | 1.1 | 1.1 | 1.2 | 1.2 | 1.4 | 1.3 | 2.1 |
|  | 240° C. oven heat resistance | 250 | 250 | 250 | 250 | 260 | 260 | 250 |
|  | 260° C. solder heat resistance | 180 | 180 | 180 | 180 | 180 | 180 | 180 |
|  | PCT | 180 | 180 | 180 | 180 | 180 | 180 | 60 |
|  | Router milling distance (0.8t * 3) | 12 | 12 | 4 | 8 | 3 | 3 | 10 |
|  | X: 0 to 4 m, Δ: 5 to 9 m, ○: 10 to 14 m, ⊗: >15 m | ○ | ○ | X | Δ | X | X | ○ |
|  | Flame retardancy | V-0 | V-0 | V-0 | V-0 | V-0 | V-0 | V-0 |
|  | Melt viscosity [Pa · s] | 3000 | 3000 | 2000 | 3000 | 500 | 800 | 15000 |
|  | Voids | Yes | Yes | No | Yes | No | No | Yes |

Table 1 shows that all the laminated bodies of Examples 1 to 11 according to the present invention exhibited high thermal conductivity, and excellent oven heat resistance and PCT heat resistance. The laminated bodies could be milled in a router, and exhibited also flame retardancy at the V-0 level.

In particular, router machinability was very good in Example 5, where the blending amount of aluminum oxide was lowered through the presence of the boehmite particles (D). Yet higher thermal conductivity could be achieved in Examples 6 to 11, in which the inorganic particles (E) were blended in.

Example 8, in which pulverized magnesium oxide (D$_{50}$: 3 μm, BET/S=6) was blended in as the inorganic particles (E) was not problematic as regards PCT heat resistance, but exhibited small blisters as a result of the moisture absorption process performed in an autoclave. Examples 9 to 11, with high packing of magnesium oxide (E) (D$_{50}$ 5 μm, BET/S=3) showed by contrast no changes derived from moisture absorption, and exhibited excellent PCT heat resistance, as well as good moldability.

Thermal conductivity was high, and router machinability very good, in Examples 10 and 11, in which boehmite particles (D) and magnesium oxide (E) (D$_{50}$: 5 μm, BET/S=3) were blended in and each component was present in a specific blending ratio.

In Example 4, where Kemgard 911C i.e. zinc molybdate on a talc carrier was used as the molybdenum compound (C), no voids occurred in the obtained copper foil-clad laminate, but the melt viscosity of the prepreg increased somewhat, and flowability during molding was poorer, on account of the high oil absorption by talc. In Example 2, by contrast, where the formulation was identical to that of Example 4 but Kemgard 911A, i.e. calcium molybdate on a calcium carbonate carrier was used as the molybdenum compound (C), the melt viscosity of the prepreg was lower than that of Example 4, and flowability during molding was good, thanks to the low oil absorption by calcium carbonate.

The results of Table 2 showed firstly that thermal conductivity cannot be achieved when the blending ratio of inorganic filler with respect to the resin component is small (Comparative Example 1). No high thermal conductivity was found when using an inorganic filler in the form of gibbsite-type aluminum hydroxide and silica of low thermal conductivity, namely 1.0 W/m·K, even for an increased blending ratio of the inorganic filler (Comparative Example 2). Router machinability was very poor and no flame retardancy could be achieved in Comparative Example 3, where aluminum oxide having an average particle size of 7 μm was used and no molybdenum compound was blended in.

If gibbsite-type aluminum hydroxide and magnesium oxide were used, and no aluminum oxide of small particle size was blended in, thermal conductivity was high, and workability good, but moldability was poor, and voids were observed to occur (Comparative Example 4).

Router machinability was very poor if gibbsite-type aluminum hydroxide was used, with no molybdenum compound blended in, and with aluminum oxide of small particle size incorporated in a substantial amount (Comparative Examples 5 to 7).

Heat resistance dropped if the content of aluminum oxide of small particle size was small and the content of gibbsite-type aluminum hydroxide was substantial (Comparative Example 8). Moldability was poor, and voids were observed to occur, if the content of aluminum oxide of small particle size was small, and the content of gibbsite-type aluminum hydroxide or magnesium hydroxide was substantial (Comparative Examples 9 and 10).

Router machinability was insufficient if no molybdenum compound was blended in, even if aluminum oxide of small particle size was added and boehmite particles were also blended in (Comparative Examples 11 and 12). Router machinability improved, but moldability became poorer, and voids occurred, when the blending ratio of aluminum oxide of small particle size was small and the blending ratio of boehmite particles was substantial (Comparative Example 12).

High thermal conductivity was achieved and moldability was likewise good, but router machinability was poor, if no molybdenum compound was blended in, aluminum oxide of small particle size, gibbsite-type aluminum hydroxide and boehmite particles were added, and magnesium oxide was blended in (Comparative Examples 13 and 14).

Moldability was poor, and voids occurred, if the blending ratio of inorganic filler exceeded 80 parts by volume, as the upper limit of the range of the present invention, with respect to 100 parts by volume of the thermosetting resin solids and inorganic filler, even though the content of inorganic filler was within the range of the present invention (Comparative Example 15).

As explained above, the thermosetting resin composition according to the present invention contains 40 to 80 parts by volume of an inorganic filler with respect to 100 parts by volume of thermosetting resin solids and the inorganic filler; the inorganic filler contains (A) at least one type of particles selected from among gibbsite-type aluminum hydroxide particles and magnesium hydroxide particles having an average particle size ($D_{50}$) of 1 to 15 μm; (B) aluminum oxide particles having an average particle size ($D_{50}$) of 1.5 μm or less; and (C) a molybdenum compound, such that the blending ratios (by volume) of the component (A), the component (B) and the component (C) with respect to 100% as the total amount of inorganic filler are component (A): 30 to 70%, component (B): 1 to 40%, and component (C): 1 to 10%.

A circuit board having such a thermosetting resin composition as a resin component exhibits excellent thermal conductivity, mechanical workability, flame retardancy, resin flow, moisture absorption insulation and price. The circuit board obtained using such a resin composition can be preferably used in various substrates from which high heat dissipation properties are required, in particular in substrates for LED mounting in which a plurality of LEDs, which generate substantial heat, is mounted on the substrate.

More preferably, the thermosetting resin composition according to the present invention further contains, as an inorganic filler, (D) boehmite particles having an average particle size (D50) of 0.1 to 3 μm, such that the blending ratios (by volume) of the component (A), the component (B), the component (C) and the component (D) with respect to 100% as the total amount of inorganic filler are component (A): 30 to 70%, component (B): 1 to 40%, component (C): 1 to 10% and component (D): 1 to 30%. Such a configuration affords higher packing of the inorganic filler, and allows reducing the blending amount of aluminum oxide, so that mechanical workability can be further enhanced as a result.

Yet higher thermal conductivity can be achieved by incorporating, into the thermosetting resin composition, (E) inorganic particles having an average particle size (D50) of 0.1 to 15 μm and having a thermal conductivity of 9 W/mK or higher, as an inorganic filler.

High thermal conductivity can be achieved yet more reliably if the inorganic microparticles (E) are magnesium oxide having an average particle size (D50) of 1 to 15 μm and satisfying the formula below:

$$1 \leq BET/S \leq 5 \qquad \text{(Formula 1)}$$

(where BET denotes a BET specific surface area, and S denotes a theoretical calculated value of specific surface area, in spherical conversion, represented by 6/(average particle size)(density)).

The above-described effect can be achieved yet more reliably, and in a well-balanced manner, if the blending ratios (by volume) of the component (A), the component (B), the component (C), the component (D) and the component (E) with respect to 100% as the total amount of inorganic filler are component (A): 30 to 50%, component (B): 1 to 20%, component (C): 1 to 10%, component (D): 10 to 30% and component (E): 10 to 50%.

A circuit board that combines excellent thermal conductivity, excellent heat resistance, also excellent drilling workability and flame retardancy is obtained when using a prepreg that is obtained by impregnating any one of the above thermosetting resin compositions into a fibrous base material (woven fabric base material or nonwoven fabric base material). Preferably, the volume ratio of the thermosetting resin composition in the prepreg ranges from 50 to 90 vol %.

A laminate in one aspect of the present invention is a laminate obtained by layering and molding of one or a plurality of sheets of the above prepreg. The present invention encompasses also a metal foil-clad laminate in which at least one surface of the above laminate is clad with a metal foil, as well as a circuit board that is obtained by forming a circuit on the metal foil-clad laminate.

Such a laminate and circuit board have highly superior properties in terms of high thermal conductivity, flame retardancy, mechanical workability, moisture absorption insulation and price, and in particular excellent heat dissipation properties. Therefore, the laminate and circuit board can be preferably used as a circuit board on which electronic components are mounted that require heat dissipation properties, such as circuit boards for LED mounting. That is, the laminate and circuit board of the present invention can be preferably used as a circuit board of a LED module in which LED elements are mounted on the circuit board. Such a LED module that utilizes the circuit board having particularly superior heat dissipation properties can be used stably over long periods of time.

The present application is based on Japanese Patent Application No. 2011-103192 filed on May 2, 2011, the contents whereof are incorporated herein by reference.

With a view to carry out the present invention, the latter has been adequately and sufficiently explained above on the basis of embodiments, with reference to accompanying drawings and so forth. However, it should be appreciated that the above-described embodiments can be easily modified and/or improved by a person skilled in the art. Unless departing from the scope of right of the appended claims, therefore, such modifications and refinements carried out by a person skilled in the art are to be understood as being encompassed within the scope of right of the claims.

INDUSTRIAL APPLICABILITY

The present invention has industrial applicability in a wide variety of industries, in the technical field of thermosetting resin compositions, prepreg, laminates, metal foil-clad laminates and circuit boards.

The invention claimed is:

1. A thermosetting resin composition, containing 50 to 70 parts by volume of an inorganic filler with respect to 100 parts by volume of thermosetting resin solids and the inorganic filler, wherein the inorganic filler contains: (A) at least one type of particles selected from among gibbsite-type aluminum hydroxide particles, which have been subjected to a heat resistance process, and magnesium hydroxide particles having an average particle size ($D_{50}$) of 1 to 15 µm; (B) aluminum oxide particles having an average particle size ($D_{50}$) of 1.5 µm or less; (C) a molybdenum compound; (D) boehmite particles having an average particle size ($D_{50}$) of 0.1 to 0.9 µm, wherein blending ratios (by volume) of the component (A), the component (B), the component (C) and the component (D) with respect to 100% as the total amount of inorganic filler are component (A): 30 to 70%, component (B): 1 to 30%, component (C): 1 to 10% and component (D): 10 to 30%, and the resistance process is performed such that a boehmite phase becomes less than 15% of the total, at a 1% dehydration temperature of 250° C. or higher.

2. The thermosetting resin composition according to claim 1, further containing, as an inorganic filler, (E) inorganic particles having an average particle size ($D_{50}$) of 0.1 to 15 µm and having a thermal conductivity of 9 W/mK or higher.

3. The thermosetting resin composition according to claim 2, wherein the inorganic microparticles (E) are magnesium oxide having an average particle size ($D_{50}$) of 1 to 15 µm and satisfying the formula below:

$$1 \leq BET/S \leq 5 \quad \text{(Formula 1)}$$

(where BET denotes a BET specific surface area [m$^2$/g], and S denotes a theoretical calculated value of specific surface area, in spherical conversion, represented by 6/(average particle size [µm])(density [g/cm$^3$])).

4. The thermosetting resin composition according to claim 2, wherein blending ratios (by volume) of the component (A), the component (B), the component (C), the component (D) and the component (E) with respect to 100% as the total amount of inorganic filler are component (A): 30 to 50%, component (B): 1 to 20%, component (C): 1 to 10%, component (D): 10 to 30% and component (E): 10 to 50%.

5. A prepreg obtained by impregnating a woven fabric base material with the thermosetting resin composition according to claim 1.

6. A prepreg obtained by impregnating a nonwoven fabric base material with the thermosetting resin composition according to claim 1.

7. The prepreg according to claim 5, wherein a volume ratio of the thermosetting resin composition ranges from 50 to 90 vol %.

8. A laminate obtained by layering and molding of one or a plurality of sheets of the prepreg according to claim 5.

9. A metal foil-clad laminate, wherein at least one surface of the laminate according to claim 8 is clad with a metal foil.

10. A circuit board obtained by forming a circuit on the metal foil-clad laminate according to claim 9.

* * * * *